United States Patent [19]

Ma

[11] Patent Number: 5,949,114
[45] Date of Patent: Sep. 7, 1999

[54] SEMICONDUCTOR DEVICE HAVING INCREASED BREAKDOWN VOLTAGE AND METHOD OF FABRICATING SAME

[75] Inventor: Manny Ma, Boise, Id.

[73] Assignee: Micron Technology, Inc., Boise, Id.

[21] Appl. No.: 08/745,093

[22] Filed: Nov. 7, 1996

[51] Int. Cl.$^6$ ................................................. H01L 29/76
[52] U.S. Cl. ............................................ 257/384; 257/413
[58] Field of Search ........................................ 257/384, 413

[56] References Cited

U.S. PATENT DOCUMENTS 5,027,185  6/1991  Liauh ........................................ 257/384
5,659,194  8/1997  Iwamatsu et al. ........................ 257/384

*Primary Examiner*—Mark V. Prenty
*Attorney, Agent, or Firm*—Seed and Berry LLP

[57] ABSTRACT

A method of fabricating bipolar junction transistors particularly suitable for electrostatic discharge protection and high voltage MOSFETs. In accordance with the invention, a mask covers bird's beaks formed between field oxide layers and doped regions of a semiconductor substrate. A silicide layer is then added to the exposed surface of the doped regions. The mask prevents the silicide layer from overlying the bird's beaks, thereby precluding the silicide layer from degrading the breakdown junction voltage of the transistor.

10 Claims, 9 Drawing Sheets

SEMICONDUCTOR DEVICE HAVING INCREASED BREAKDOWN VOLTAGE AND METHOD OF FABRICATING SAME

TECHNICAL FIELD

This invention relates to semiconductor device fabrication, and more particularly to transistors made using a siliciding process for semiconductor devices that does not significantly reduce the junction breakdown voltages of such devices.

BACKGROUND OF THE INVENTION

Metal oxide silicon field effect transistors ("MOSFETs") are in common use in integrated circuits performing a variety of functions such as microprocessors, memory devices, etc. A typical MOSFET 10 is illustrated in FIG. 1. The MOSFET 10 is formed on a substrate 12 of a silicon wafer which has been doped to be of a particular type which, in the example of FIG. 1, is p-type. An active portion of the MOSFET 10 is formed between areas 16, 18 of a field oxide layer of silicon dioxide $SiO_2$. The field oxide areas 16, 18 are typically formed by exposing the silicon wafer 12 to oxygen at an elevated temperature thereby allowing the oxygen to react with the silicon. The field oxide also forms a gate oxide layer 20.

The substrate 12 on opposite sides of the gate insulator 20 is doped with a type different from the doping of the substrate 12. In the example of FIG. 1, n-type regions 30, 32 are formed in the p-type substrate 12. Deeper n-type regions 34, 36 are also formed in the center of the n-type regions 30, 32, respectively, for reasons that will be explained below. The region 30 forms the source of the MOSFET 10 while the region 32 forms the drain of the MOSFET 10. A gate 40 of the MOSFET 10 is formed on the gate oxide layer 20 by a conductive polysilicon layer.

After the above-described components of the MOSFET 10 have been formed, the substrate 12 is covered with a passivation layer 44, such as boron phosphorus silicate glass. Vias 48 formed in the passivation layer 44 provide a path for conductors 50, 52 to extend to the source region 30 and the drain region 32. Other conductors (not shown in FIG. 1) which are also part of a metalization layer extend to the gate 40 and to other MOSFETs and other components on the integrated circuit.

As mentioned above, relatively deep n-type regions 34, 36 are formed at the center of the source and drain regions 30, 32, respectively. The purpose of these deep n-type regions 34, 36 is to isolate the conductors 50, 52 from the substrate 12 in the event that the conductors 50, 52 penetrate too deeply into the source and drain regions 30, 32, respectively. However, in FIG. 1, the conductors 50, 52 are shown extending through vias in the passivation layer 44 and terminating at the surface of the substrate 12. In practice, the conductor 50, 52 may penetrate a sufficient distance into the regions 30, 32 to short to the substrate 12.

In operation, current flows from the drain conductor 52 to the source conductor 50 whenever the voltage applied to the gate 40 is greater than the voltage on the source conductor 50 by the threshold voltage $V_T$ of the MOSFET 10. Current flowing from the drain conductor 52 spreads out as it flows through the drain region 32 as illustrated by the arrows in FIG. 1. Similarly, current converges from several directions as it flows through the source region 30 to the source conductor 50.

As is well known in the art, the MOSFET structure shown in FIG. 1 is replete with capacitances. For example, the gate 40 and the substrate 12 form two plates of a capacitor separated by the gate oxide layer 20, and capacitances are also formed between the gate 40 and the n-type regions 30, 32 as well as between the n-type regions 30, 32 and other components. The switching speed of a MOSFET is a function of the time constant of the various components. The time constant is equal to the product of resistance and capacitance. Thus, for example, a higher resistance in the source region 30 results in a longer time for the source-to-drain voltage to reach a desired magnitude. An important factor in this high resistance is the resistance along the surface layer of the n-type regions 30, 32 as the current flows to or from the conductors 50, 52 as shown by the arrows, as explained above. If the conductors 50, 52 could contact the entire surfaces of the n-type regions 30, 32, respectively, or the surface resistances of the regions 30, 32 could be reduced, the switching time constants of the MOSFET 10 could be correspondingly reduced. A faster time constant would allow microprocessors, memory devices, etc., composed of MOSFETs to operate at a higher speed.

One conventional technique for reducing the resistance of MOSFETs is illustrated in FIG. 2 in which components of the MOSFET 60 that are identical to the MOSFET 10 of FIG. 1 have been provided with the same reference numeral. The prior art MOSFET 60 uses a siliciding process explained below with reference to FIG. 2. In the initial process steps, the field oxide areas 16, 18, the gate oxide layer 20, the gate 40 and the n-type regions 30, 32, 34, 36 are formed in the substrate 12, as illustrated in FIG. 2A.

The MOSFET 60 differs from the MOSFET 10 of FIG. 1 by the addition of silicide layers 64, 66 to the surface of the n-type source and drain regions 30, 32, respectively. Basically, siliciding is a process by which a metal silicon compound is formed in the surface of a silicon substrate 12 to reduce the surface resistance of the substrate 12. Siliciding is typically performed by coating the surface of the substrate 12 with a metal such as titanium, tungsten or molybdenum. The metal is then allowed to react with the silicon to form titanium silicide, tungsten silicide or moly silicide, respectively. Since siliciding consumes a portion of the surface of the silicon, the silicide layers 64, 66 shown in FIG. 2B extend below the original surface of the substrate 12. As shown in FIG. 2B, the silicide layers are masked by the field oxide areas 16, 18 in a process known as self-aligned siliciding, also known as saliciding. However, the silicide layers 64, 66 may also be formed using a dedicated mask (not shown).

After the silicide layers 64, 66 have been added as shown in FIG. 2B, the passivation layer 44 and the metal conductors 50, 52 are added, as shown in FIG. 2C. As further shown in FIG. 2C, the relatively low surface resistance of the silicide layers 64, 66 allows the current to spread out and flow directly into the drain region 32 and out of the source region 30. This reduced resistance allows spurious capacitances in the MOSFET 60 to be charged more rapidly. As a result, microprocessors, memory devices, and other semiconductor devices fabricated using a siliciding process as shown in FIG. 2 can operate at relatively high speeds.

Siliciding is also used to reduce the surface resistance of active areas of bipolar junction transistors 70, as illustrated in FIG. 3. As shown in FIG. 3A, a bipolar junction transistor 70 is fabricated by first forming a field oxide layer on a silicon substrate 72 at areas 74, 76, 78. As shown in FIG. 3A, the substrate 72 is doped with p-type material to form a p-type substrate 72. Next, as shown in FIG. 3B, the exposed areas of the substrate 72 between the field oxide areas 74–78 are doped to form an n-type collector 80 and an n-type emitter 82. As with the MOSFET 60 shown in FIG. 2, relatively deep n-type regions 84, 86 are also formed to prevent conductors from shorting to the substrate 72, as explained below. The n-type regions 80, 82 and the p-type substrate 72 form an N-P-N transistor as shown schematically at 88.

In the next step, silicide layers 90, 92 are formed on the exposed surfaces of the collector and emitter regions 80, 82, respectively. As with the MOSFET 60 of FIG. 2, the silicide layers 90, 92 are applied using the field oxide areas 74, 76, 78 as a mask in a saliciding process. However, a dedicated mask may also be used. After the silicide layers 90, 92 have been applied, a passivation layer 96 of a suitable material, such as boron phosphorous silicate glass, having etched vias 98 is deposited over the substrate 72, as illustrated in FIG. 3D. Finally, conductors 100, 102 are formed in a metalization layer as shown in FIG. 3E. The conductors 100, 102 extend through the vias 98 to contact the silicide layers 90, 92, respectively. The silicide layers 90, 92 allow the current to easily spread out and flow directly through the n-type regions 80, 82, as illustrated by the arrows in FIG. 3E. By reducing the surface resistance of the n-type regions 80, 82, the silicide layers 90, 92 allow the transistor 70 to switch more rapidly. As a result, semiconductor devices formed with the transistor 70 shown in FIG. 3 can operate at a higher speed.

Although the siliciding processes shown in FIGS. 2 and 3 have improved the operating speed of MOSFET and bipolar junction transistors, the siliciding process has caused certain problems. Specifically, the silicide layers can reduce the breakdown voltage between a region doped with one polarity and a substrate doped with the other polarity. This problem is illustrated in FIG. 4. Because of the manner in which the field oxide areas 16, 74 forms, it has an exposed sloped edge 110 and a burried sloped edge 112 formed in the substrate. The exposed sloped edge 110 joins the burried sloped edge 112 at an area known as the "bird's beak" 114. Similarly, because of the manner in which the doping of the n-type regions 30, 80 occurs, the n-type regions have a sloped boundary 116 formed in the substrate 12, 72. The structures shown in FIG. 4 makes the n-p junction at the bird's beak 114 relatively easy to break down, particularly since the silicide layer 64, 90 consumes the upper portion of the substrate 12, 72. As a result, the n-p junction between the n-type region 30, 80 and the substrate 12, 72 can easily break down at the bird's beak 14 at a relatively low voltage.

Although the problem of low breakdown voltages can exist in any MOSFET or bipolar transistor, it is primarily a problem with high voltage MOSFETs and bipolar junction transistors used for electrostatic discharge protection of MOSFET circuits. With reference to FIG. 5, a bipolar junction transistor 70 is commonly used to protect semiconductor circuits 130 in an integrated circuit 132 formed on a substrate. The semiconductor circuits 130 are connected to external circuitry through a connection pad 134. As is well known in the art, the semiconductor circuits 130 are composed of MOSFETs fabricated on a substrate of the integrated circuit 132. The bipolar junction transistor 70 protects the more fragile MOSFETs used in the semiconductor circuitry 130 by connecting the collector of the transistor 70 to the pad 134 and grounding the emitter of the transistor 70. The base of the transistor is connected to the substrate 72 of the integrated circuit 132, as illustrated in FIG. 3. It is important that the n-type regions 80, 82 of the transistor 70 do not break down at excessively low voltages. However, the n-p junctions of the transistor 70 may break down at excessively low voltages because of the presence of the silicide layers 90, 92 at the bird's beak 114, as shown in FIG. 4.

As a result of the above-described problems, semiconductor device designers must now generally choose between using siliciding to operate at a high speed while suffering the attendant reduced junction breakdown voltages or, in order to obtain an adequate junction breakdown voltage, fabricate semiconductor devices that are incapable of operating at a relatively high speed. There is therefore a need for semiconductor devices and a method of fabricating semiconductor devices that allows both a high breakdown junction voltage and low surface resistance to obtain a high operating speed.

SUMMARY OF THE INVENTION

The inventive semiconductor device and method of fabricating same can be used to form either a bipolar transistor or a field effect transistor, as well as other junction devices such as diodes. The semiconductor device is formed on a silicon substrate having a field oxide layer formed on its surface. The field oxide layer leaves exposed at least one region of the substrate that is doped to form a semiconductor junction. The boundary of the field oxide layer adjacent the doped area forms a bird's beak. A mask layer extends over the field oxide layer and a portion of the doped region to overly the bird's beak. However, the mask layer leaves a portion of the doped region exposed. At least part of the exposed portion of the doped region is covered with a silicide layer. Significantly, the mask prevents the silicide layer from covering the doped region at the bird's beak which might otherwise reduce the junction breakdown voltage.

In the event that the semiconductor device is a transistor, first and second doped regions are formed each having a boundary along at least one edge of the field oxide layer forming bird's beaks at the boundaries. The mask layer extends from the field oxide layer over the bird's beaks and onto the doped regions to isolate the bird's beaks from silicide layers that are subsequently added to at least a portion of each of the doped regions.

If the transistor is a bipolar transistor, its collector is formed by the first doped region, its emitter is formed by the second doped region, and its base is formed by the substrate. A portion of the field oxide layer is positioned between the first and second doped regions, and bird's beaks are also formed at these boundaries between the field oxide layer and the doped regions. These bird's beaks are also covered by the mask layer prior to siliciding the doped regions.

If the transistor is a field effect transistor, its source is formed by the first doped region, and its drain is formed by the second doped. A gate is formed on a channel region of the substrate between the first and second doped regions. The bird's beaks formed by the field oxide layer adjacent the first and second doped regions are covered by the mask layer prior to siliciding the doped regions. The mask layer also preferably covers at least a portion of the gate to overly the first and second doped regions adjacent the gate.

DETAILED DESCRIPTION OF THE INVENTION

Figure 3A:
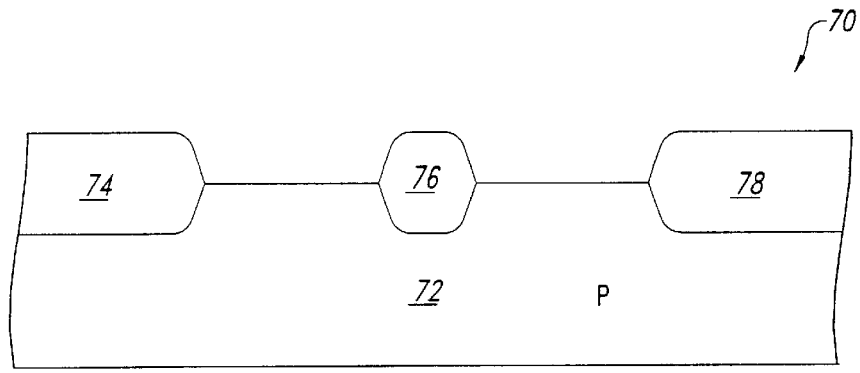
FIGS. 3A–E are cross-sectional views of a process for manufacturing a bipolar junction transistor with silicide layers to increase the operating speed of the transistor.
Figure 3B:
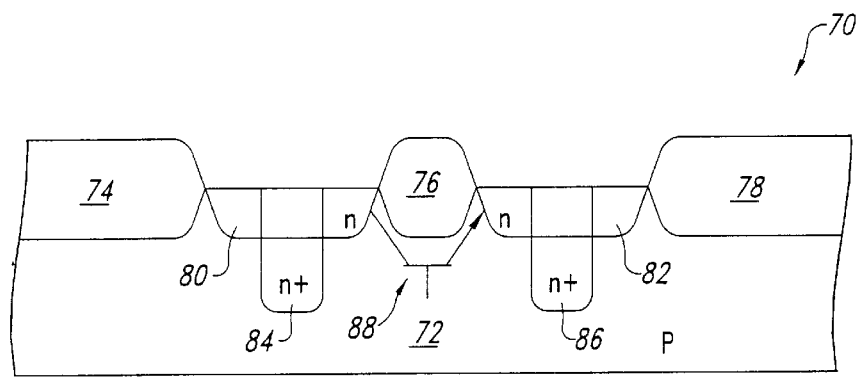
Figure 3C:
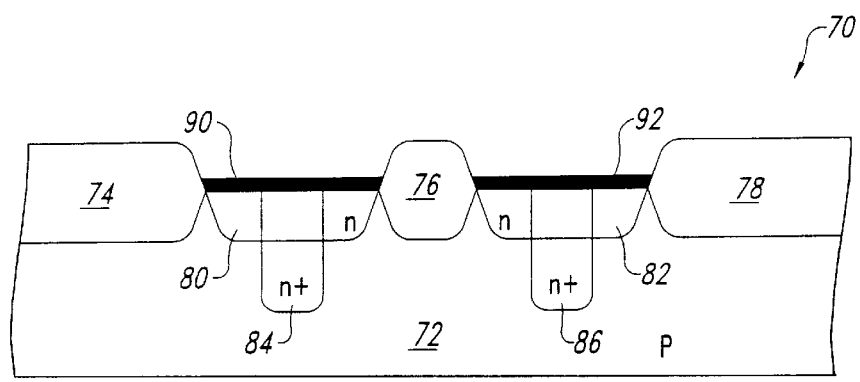
Figure 3D:
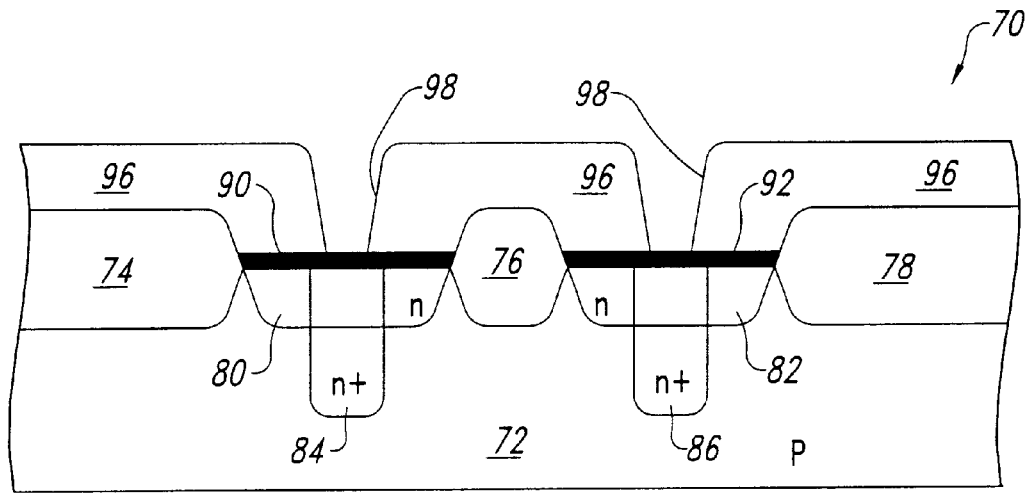
Figure 3E:
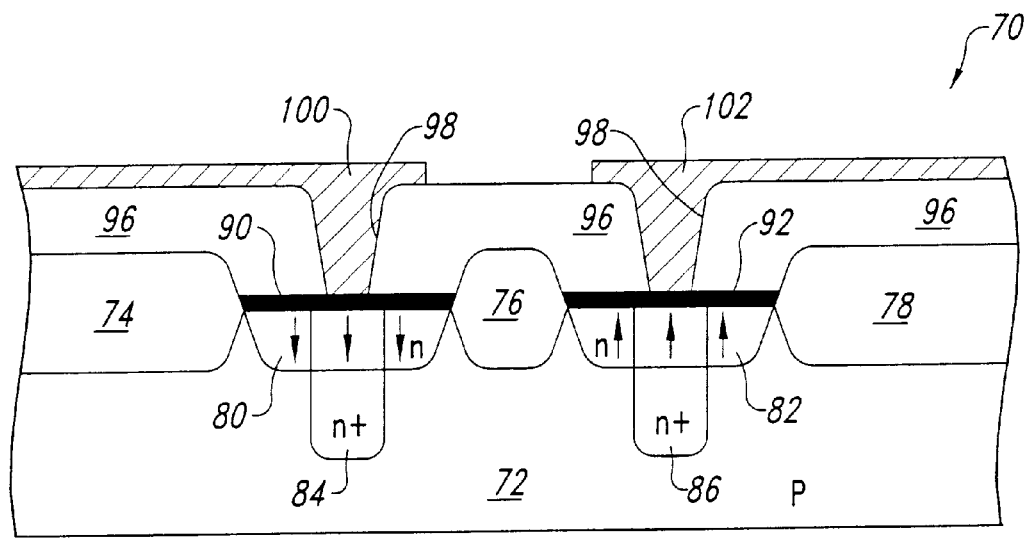
Figure 4:
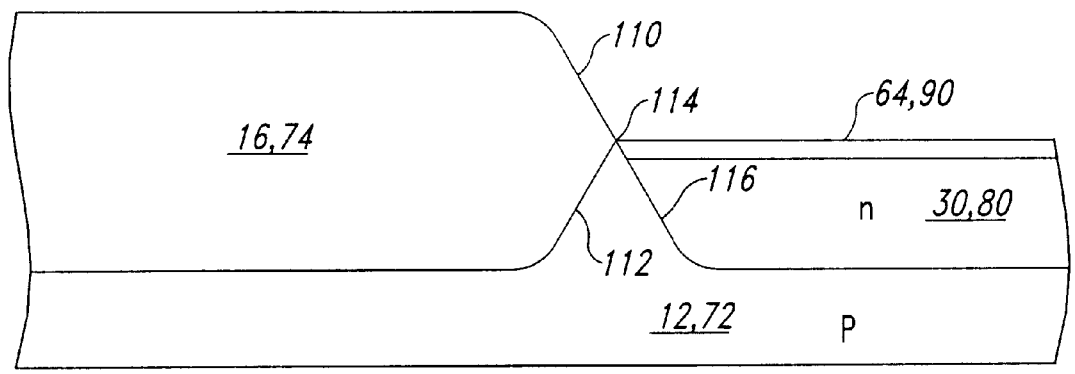
FIG. 4 is a detailed cross-sectional view of the boundary between field oxide areas and doped regions of the transistors of FIGS. 2 and 3 illustrating a problem resulting from siliciding the transistors of FIGS. 2 and 3.
Figure 6A:
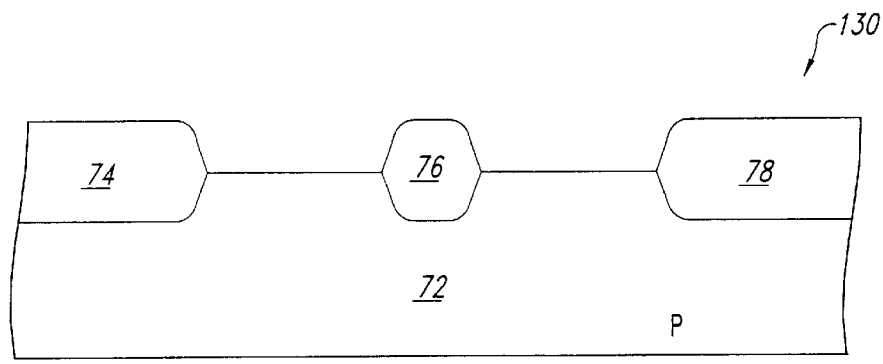
FIGS. 6A–F are cross-sectional views showing a process for manufacturing bipolar junction transistors having silicide layers without the problem explained with reference to FIG. 4.
Figure 6B:
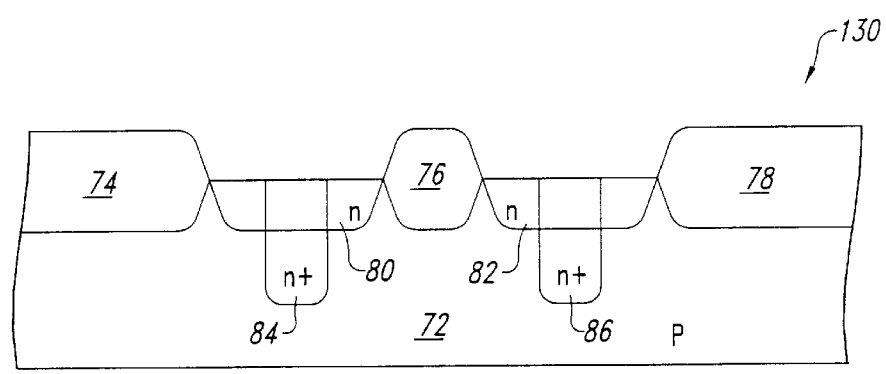
Figure 6C:
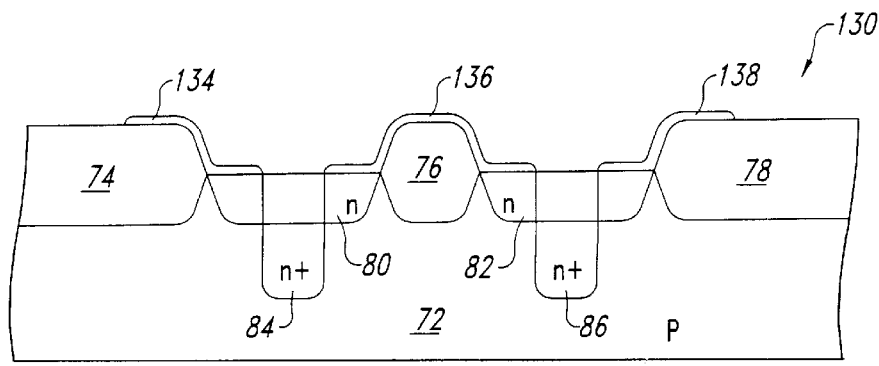
Figure 6D:
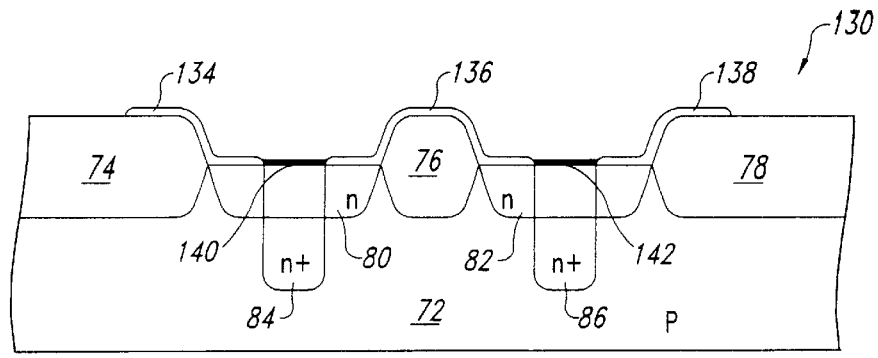

A process for forming a bipolar junction transistor 70 in accordance with the invention is illustrated in FIGS. 6A–F. Many of the steps shown in FIGS. 6A–F are the same as the steps shown in FIGS. 3A–E to form a prior art bipolar junction transistor 70. Therefore, in the interest of brevity and clarity, the components of the inventive bipolar transistor 130 that are identical the components of the prior art bipolar transistor 70 have been provided with the same reference numeral. As shown in FIG. 6A, the field oxide areas 74–78 are added to the substrate 72 in the same manner as explained above with reference to FIG. 3A. Similarly, the n-type regions 80, 82, 84, 86 are formed in the substrate 72 in the same manner as explained above with reference to FIG. 3B. The process of forming the inventive transistor 130 departs from the prior art in FIG. 6C in which masks 134, 136, 138 are formed on the field oxide areas 74–78 and the n-type regions 80, 82. Significantly, the masks 134–138 overly the bird's beaks 114 formed at the boundaries of the field oxide areas 74–78 and the n-type regions 80, 82. While the masks 134–138 may be formed with any suitable material, they are preferably formed from silicon dioxide deposited in accordance with a conventional semiconductor process.

After the masks 134–138 have been formed, silicide layers 140, 142 are formed on the portions of the surfaces of the n-type regions 80, 82, respectively, left exposed by the masks 134–138. It will be apparent from FIG. 6D that the masks 134–138 prevent the silicide layers 140, 142 from overlying the bird's beaks 114 formed at the boundaries of the field oxide areas 74–78. As a result, the silicide layers 140, 142 do not unduly reduce the breakdown junction voltage of the n-p junctions formed between the n-type regions 80, 82 and the substrate 72. Although the masks 134–138 are shown in FIG. 6 as exposing less than one-half the surface of the n-type regions 80, 82, it will be understood that a greater or lesser portion of the surface of the n-type regions 80, 82 may be exposed as long as the boundaries between the field oxide areas 74–78 and the n-type regions 80, 82 are covered.

Figure 6E:
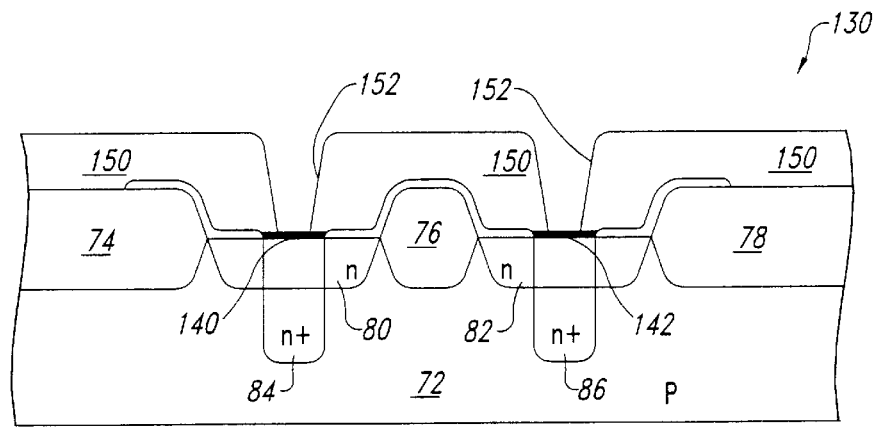

As shown in FIG. 6E, after the silicide layers 140, 142 have been added, a passivation layer 150 of a suitable material, such as boron phosphorous silicate glass, is added. Vias 152 are formed in the passivation layer 150 over the center of the n-type regions 80, 82 by suitable means.

Figure 6F:
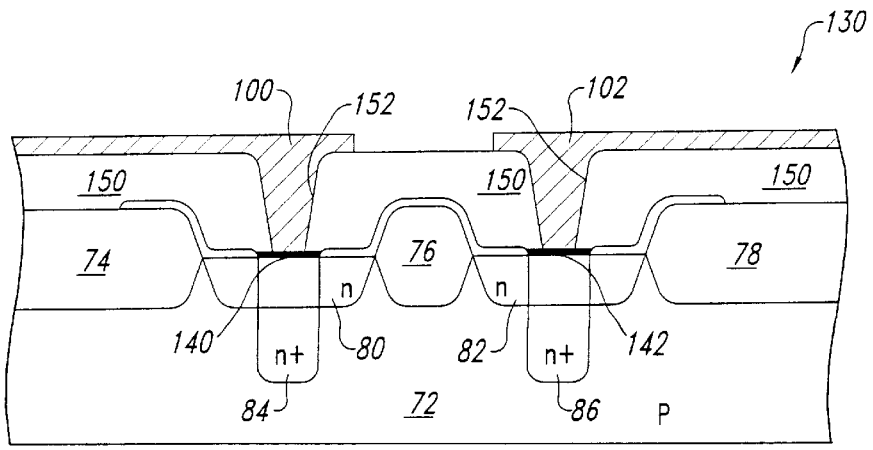

Finally, as illustrated in FIG. 6F, conductors 100, 102 are formed from a metalization layer to make contact with the silicide layers 140, 142 through the vias 152. As with the bipolar junction transistor 70 of FIG. 3, the relatively deep n-type regions 84, 86 prevent the conductors 100, 102, respectively, from shorting to the substrate 72 in the event that the conductors 100, 102 excessively penetrate the n-type regions 80, 82, respectively.

Figure 5:
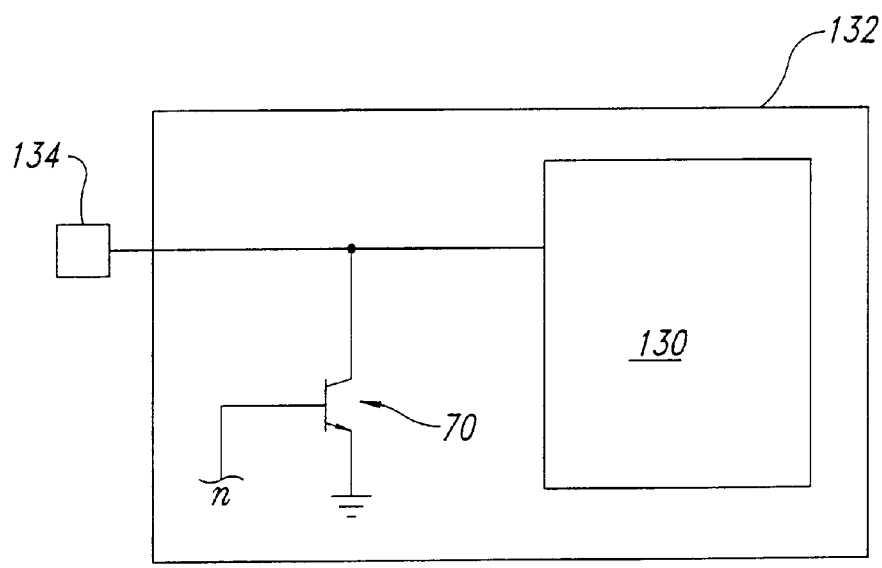
FIG. 5 is a schematic and block diagram illustrating the manner in which bipolar junction transistors have been used for electrostatic discharge protection of semiconductor devices.

The bipolar junction transistor 130 shown in FIG. 6 is particularly suitable for use as an electrostatic discharge protection transistors, as illustrated in FIG. 5, since the silicide layers 140, 142 do not degrade the junction breakdown voltage of the transistor 130.

Figure 1:
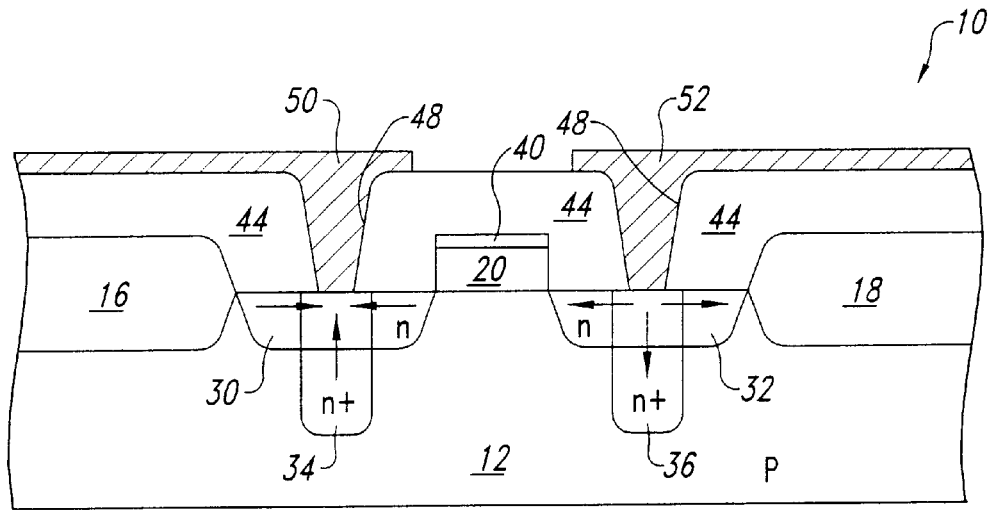
FIG. 1 is a cross-sectional view of a conventional metal oxide silicon field effect transistor.
Figure 2A:
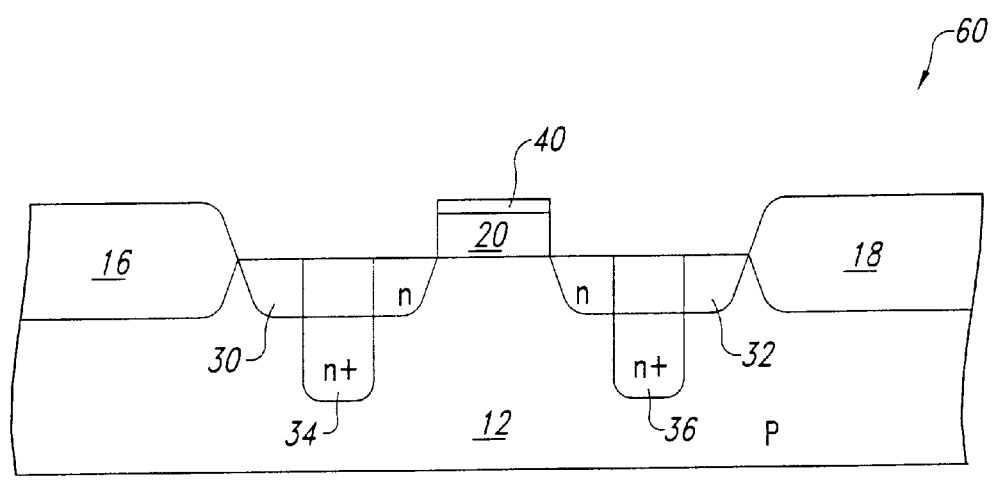
FIGS. 2A–C are cross-sectional views showing a process for manufacturing the metal oxide silicon field effect transistor with silicide layers to improve the operating speed of the transistor.
Figure 2B:
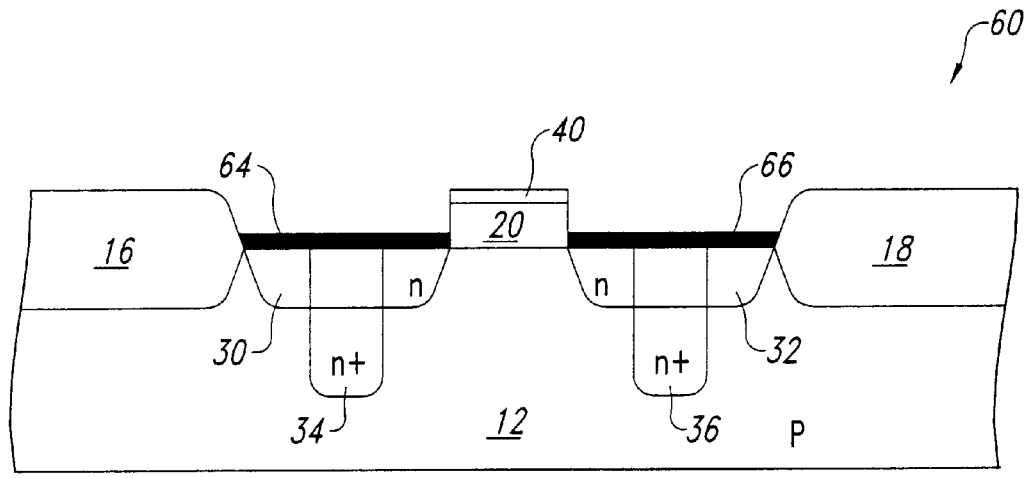
Figure 2C:
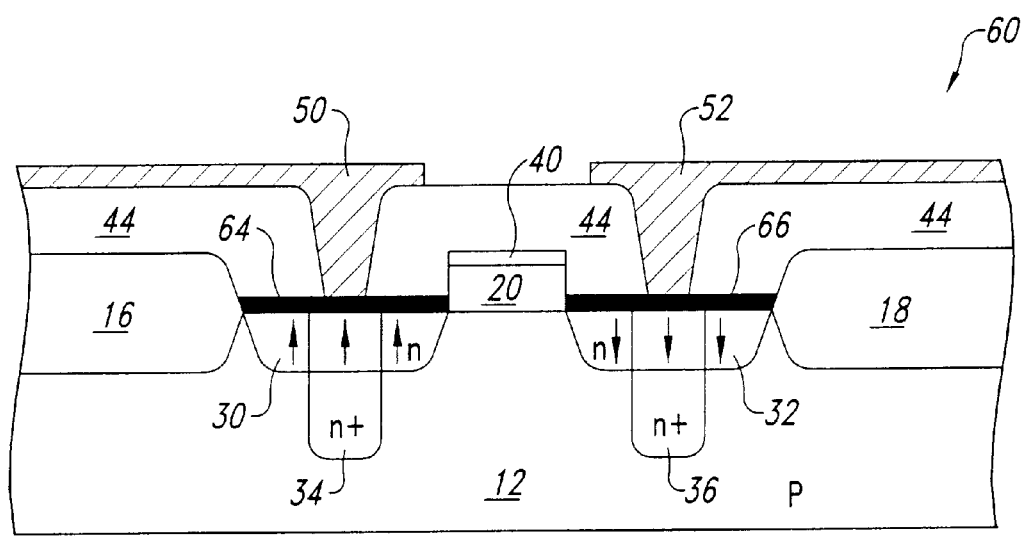
Figure 7A:
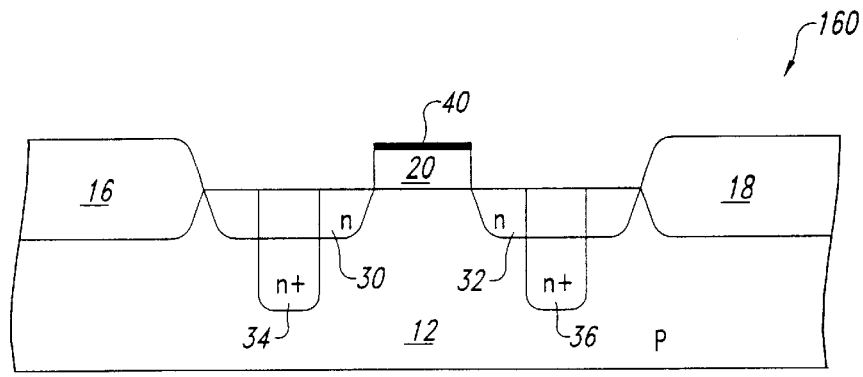
FIGS. 7A–D are cross-sectional views showing a process for manufacturing metal oxide silicon field effect transistors having a silicide layer without the disadvantages explained with reference to FIG. 4.
Figure 7B:
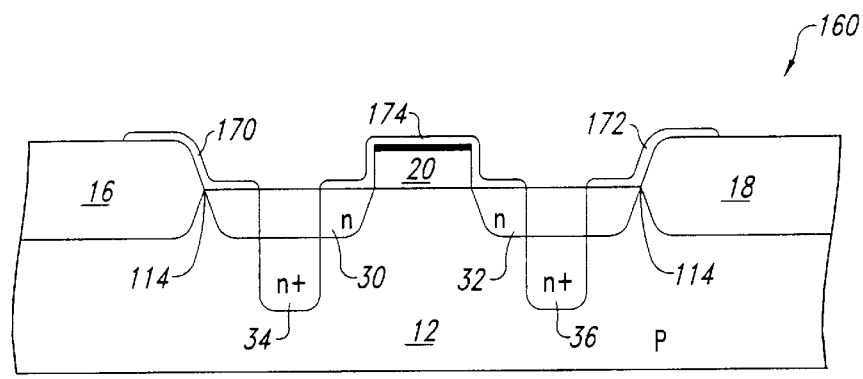

The inventive process for manufacturing transistors using a siliciding process that does not degrade the junction breakdown voltage can also be used to fabricate MOSFETs, as illustrated in FIGS. 7A–D. The process used for fabricating a MOSFET 160 in accordance with the invention is identical in many respects to the conventional process for forming MOSFETs illustrated in FIG. 2. Therefore, in the interest of brevity and clarity, components of the MOSFET 160 shown in FIG. 7 that are identical to the components of the MOSFET transistor 60 shown in FIG. 2 have been provided with the same reference numerals. As illustrated in FIG. 7A, the field oxide areas 16, 18, the n-type regions 30, 32, 34, 36, the gate oxide layer 20 and the gate 40 are fabricated as explained above with reference to FIG. 2A. However, prior to siliciding the n-type regions 30, 32, the bird beaks 114 between the field oxide areas 16, 18 in the n-type regions 30, 32 are covered with masks 170, 172. As with the process for forming the bipolar junction transistor 130 of FIG. 6, the masks 170, 172 may be of any suitable material such as silicon dioxide. The boundary between the n-type regions 30, 32 in the gate oxide 20 are similarly covered with a mask 174.

Figure 7C:
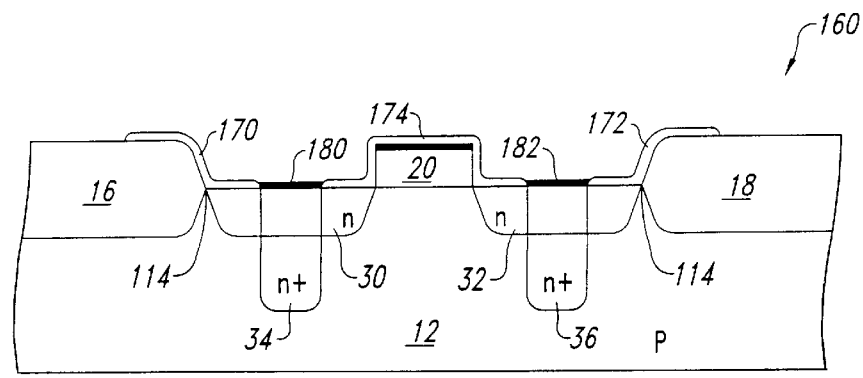
Figure 7D:
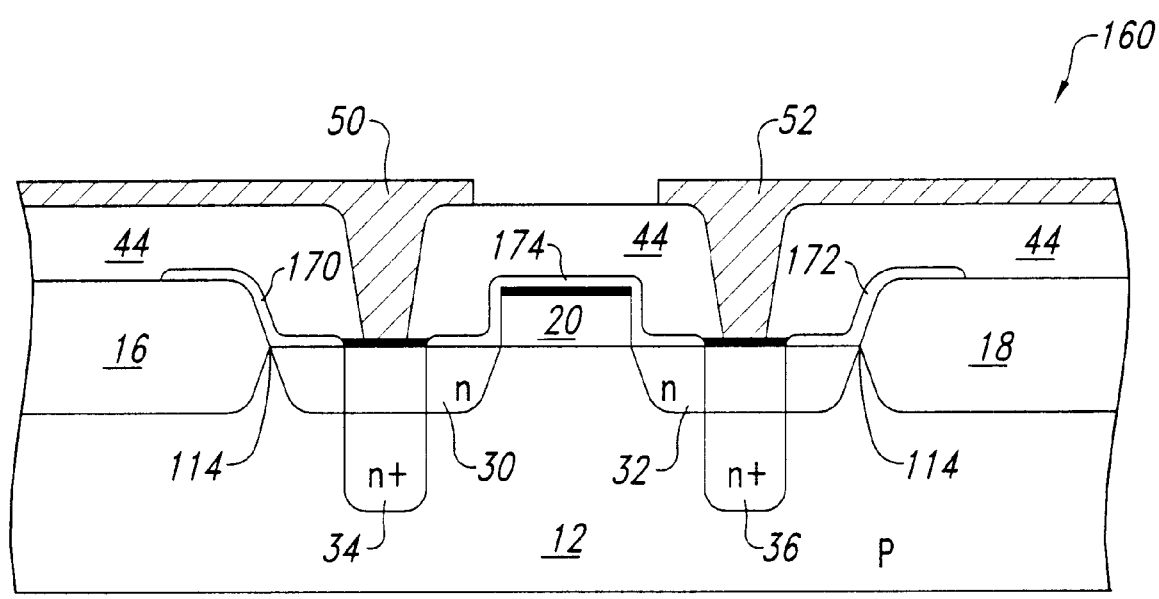

As shown in FIG. 7C, after the masks 170–174 have been added, silicide layers 180, 182 are formed on portions of the surfaces of the n-type regions 30, 32, respectively, left exposed by the masks 170–174. As with the bipolar junction transistor 130 shown in FIG. 6, the masks 170–174 prevent the silicide layers 180, 182 from overlying the bird's beaks 114, thereby preventing the silicide layers 180, 182 from degrading the breakdown junction voltage of the transistor 160. In final steps illustrated in FIG. 7D, the passivation layer 44 and conductors 50, 52 are added, as explained above with reference to FIG. 2C.

The inventive transistor and fabrication method has been explained above with reference to two illustrative embodiments. However, it will be understood that the inventive process may be applied to other semiconductor devices without departing from the scope or spirit of the invention. Further, it will be understood that variations in the disclosed embodiments, such as the percentage of surface area silicided, etc., may be varied as desired.

Thus, although specific embodiments of the invention have been described herein for purposes of illustration, various modifications may be made without departing from the spirit and scope of the invention. Accordingly, the invention is not limited except as by the appended claims.

I claim:

1. A field effect transistor comprising:

a silicon substrate on which said transistor is to be fabricated;

a source formed by a first doped region of said silicon substrate having a boundary along at least one edge thereof;

a drain formed by a second doped region of said silicon substrate having a boundary along at least one edge thereof;

a gate overlying said substrate between said first and second doped regions;

a first field oxide layer area fabricated on said silicon substrate, said first field oxide layer area adjoining the boundary of said first doped region and forming a first bird's beak at said boundary;

a second field oxide layer area fabricated on said silicon substrate, said second field oxide layer area adjoining the boundary of said second doped region and forming a second bird's beak at said boundary;

a first mask extending over said first field oxide layer area and a portion of said first doped region to overlie said first bird's beak, said first mask further extending over said second field oxide layer area and a portion of said second doped region to overlie said second bird's beak;

a second mask extending over said gate and a portion of said first and second doped regions;

said first and second masks leaving portions of the first and second doped regions exposed;

a first silicide layer covering at least part of the exposed portion of the first doped region and a second silicide layer covering at least part of the exposed portion of the second doped region; and a passivation layer covering said field oxide layers, said first and second masks and portions of the first and second silicide layers.

2. The transistor of claim 1 wherein said field effect transistor comprises a metal oxide silicon field effect transistor.

3. The transistor of claim 1 wherein said first mask comprises a silicon oxide layer.

4. The transistor of claim 1, further including a relatively deep n-type region formed beneath each of said doped regions, said n-type regions being doped with the same semiconductor type as said doped regions.

5. The transistor of claim 1 wherein said passivation layer leaves at least a portion of said first and second silicide layers exposed.

6. The transistor of claim 1, further comprising respective first and second layers of metal overlying said passivation layer and contacting at least part of the exposed portions of said first and second silicide layers.

7. A field effect transistor having a source, a gate, and a drain, said field effect transistor comprising:

a silicon substrate on which said transistor is to be fabricated;

a gate overlying a channel region of said silicon substrate;

a first doped region of said silicon substrate forming said source, said first doped region having a first boundary adjacent said gate and a second boundary extending along an edge thereof opposite the edge adjacent said gate;

a second doped region of said silicon substrate forming said drain, said second doped region having a first boundary adjacent said gate and a second boundary extending along an edge thereof opposite the edge adjacent said gate;

a field oxide layer fabricated on said silicon substrate, said field oxide layer adjoining the second boundary of said first doped region and forming a first bird's beak at said boundary and adjoining the second boundary of said second doped region and forming a second bird's beak at said boundary;

a mask layer extending over said field oxide layer and a portion of said first doped region to overlie said first bird's beak, extending over said field oxide layer and a portion of said second doped region to overlie said second bird's beak, and extending over said gate and a portion of said first and second doped regions to overlie the first boundaries of said first and second doped regions, said mask layer leaving a portion of said first doped region and a portion of said second doped region exposed;

a first silicide layer covering at least part of the exposed portion of the first doped region and a second silicide layer covering at least part of the exposed portion of the second doped region; and a passivation layer overlying said field oxide layer, said mask layer and said silicide layers.

8. The field effect transistor of claim 7 wherein said mask layer comprises a silicon oxide layer.

9. The field effect transistor of claim 7 wherein said passivation layer leaves at least a portion of said first and second silicide layers exposed.

10. The field effect transistor of claim 7, further comprising respective first and second layers of metal overlying said passivation layer and contacting at least part of the exposed portions of said first and second silicide layers.

* * * * *